(12) United States Patent
Ranjan et al.

(10) Patent No.: US 9,653,105 B2
(45) Date of Patent: May 16, 2017

(54) SUBLAYERS FOR MAGNETICALLY SOFT UNDERLAYER

(75) Inventors: Rajiv Y Ranjan, San Jose, CA (US); Jeffrey S Reiter, Palo Alto, CA (US); Thomas P Nolan, Fremont, CA (US)

(73) Assignee: Seagate Technology LLC, Cupertino, CA (US)

( * ) Notice: Subject to any disclaimer, the term of this patent is extended or adjusted under 35 U.S.C. 154(b) by 721 days.

(21) Appl. No.: 12/882,053

(22) Filed: Sep. 14, 2010

(65) Prior Publication Data

US 2011/0223445 A1    Sep. 15, 2011

Related U.S. Application Data

(63) Continuation of application No. 10/776,203, filed on Feb. 12, 2004, now Pat. No. 7,837,836.

(51) Int. Cl.
| | |
|---|---|
| *G11B 5/66* | (2006.01) |
| *G11B 5/851* | (2006.01) |
| *C23C 14/16* | (2006.01) |
| *C23C 14/18* | (2006.01) |
| *C23C 14/20* | (2006.01) |
| *C23C 14/35* | (2006.01) |
| *C23C 14/56* | (2006.01) |

(52) U.S. Cl.
CPC ............ *G11B 5/851* (2013.01); *C23C 14/165* (2013.01); *C23C 14/185* (2013.01); *C23C 14/205* (2013.01); *C23C 14/352* (2013.01); *C23C 14/568* (2013.01)

(58) Field of Classification Search
None
See application file for complete search history.

(56) References Cited

U.S. PATENT DOCUMENTS

| | | | | |
|---|---|---|---|---|
| 5,815,342 | A * | 9/1998 | Akiyama et al. | 360/97.11 |
| 6,808,783 | B1 * | 10/2004 | Lin et al. | 428/832 |
| 2002/0182446 | A1 * | 12/2002 | Takenoiri et al. | 428/694 TS |
| 2003/0049495 | A1 * | 3/2003 | Sakai et al. | 428/694 TM |

* cited by examiner

*Primary Examiner* — Holly Rickman
*Assistant Examiner* — Linda Chau (57) ABSTRACT

A method of forming a uniform thickness layer of a selected material on a surface of a substrate comprises steps of:
(a) providing a multi-stage cathode sputtering apparatus comprising a group of spaced-apart cathode/target assemblies and a means for transporting at least one substrate/workpiece past each cathode/target assembly, each cathode/target assembly comprising a sputtering surface oriented substantially parallel to the first surface of the substrate during transport past the group of cathode/target assemblies, the group of cathode/target assemblies adapted for providing different angular sputtered film thickness profiles; and
(b) transporting the substrate past each cathode/target assembly while providing different sputtered film thickness profiles from at least some of the cathode/target assemblies, such that a plurality of sub-layers is deposited on the surface of the substrate/workpiece which collectively form a uniform thickness layer of the selected material.

20 Claims, 3 Drawing Sheets

SUBLAYERS FOR MAGNETICALLY SOFT UNDERLAYER

CROSS-REFERENCE TO RELATED APPLICATION

This application claims priority from U.S. patent application Ser. No. 10/776,203, filed Feb. 12, 2004, the entire disclosure of which is incorporated herein by reference.

FIELD OF THE INVENTION

The present invention relates to a method and apparatus for forming uniform thickness layers of a selected material by means of plural sputter deposition stages. The invention has particular utility in the automated manufacture of high performance perpendicular magnetic recording media, e.g., hard disks, at high product throughput rates.

BACKGROUND OF THE INVENTION

Magnetic media are widely used in various applications, particularly in the computer industry, and efforts are continually made with the aim of increasing the areal recording density, i.e., bit density, of the magnetic media. In this regard, so-called "perpendicular" recording media have been found to be superior to the more conventional "longitudinal" media in achieving very high bit densities. In perpendicular magnetic recording media, residual magnetization is formed in a direction perpendicular to the surface of the magnetic medium, typically comprised of a layer of a magnetically "hard" recording material on a suitable substrate. Very high linear recording densities are obtainable by utilizing a "single-pole" magnetic transducer or "head" with such perpendicular magnetic media.

Efficient, high bit density recording utilizing a perpendicular magnetic medium requires interposition of a relatively thick (as compared with the magnetic recording layer), magnetically "soft" underlayer ("SUL") layer, i.e., a magnetic layer of a ferromagnetic material having a relatively low coercivity below about 1 kOe, such as of a NiFe alloy (Permalloy), between the non-magnetic substrate, e.g., of glass, aluminum (Al) or an Al-based alloy, and the magnetically "hard" recording layer having relatively high coercivity of several kOe, typically about 3-6 kOe, e.g., of a cobalt-based alloy (e.g., a Co—Cr alloy such as CoCrPtB) having perpendicular anisotropy. The magnetically soft underlayer serves to guide magnetic flux emanating from the head through the magnetically hard perpendicular recording layer.

Figure 1:
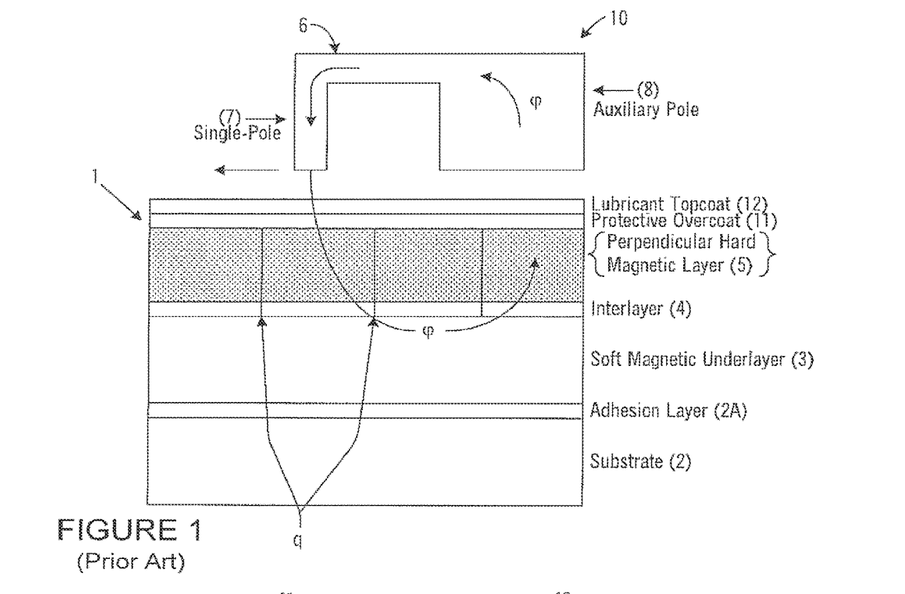
FIG. 1 schematically illustrates, in simplified cross-sectional view, a portion of a magnetic recording, storage, and retrieval system comprised of a perpendicular magnetic recording medium and a single pole transducer head.

A typical conventional perpendicular recording system 10 utilizing a perpendicular magnetic medium 1 with a relatively thick magnetically soft underlayer, a relatively thin magnetically hard recording layer, and a single-pole head, is illustrated in FIG. 1, wherein reference numerals 2, 2A, 3, 4, and 5, respectively, indicate a non-magnetic substrate, an adhesion layer (optional), a magnetically soft underlayer, at least one non-magnetic interlayer, and at least one magnetically hard perpendicular recording layer. Reference numerals 7 and 8, respectively, indicate the single and auxiliary poles of a single-pole magnetic transducer head 6. The relatively thin interlayer 4 (also referred to as an "intermediate" layer), comprised of one or more layers of non-magnetic materials, serves to: (1) prevent magnetic interaction between the magnetically soft underlayer 3 and the at least one magnetically hard recording layer 5; and (2) promote desired microstructural and magnetic properties of the at least one magnetically hard recording layer.

As shown by the arrows in the figure indicating the path of the magnetic flux $\phi$, flux $\phi$ is seen as emanating from single pole 7 of single-pole magnetic transducer head 6, entering and passing through the at least one vertically oriented, hard magnetic recording layer 5 in the region below single pole 7, entering and traveling within soft magnetic underlayer 3 for a distance, and then exiting therefrom and passing through the at least one magnetically hard perpendicular recording layer 5 in the region below auxiliary pole 8 of single-pole magnetic transducer head 6. The direction of movement of perpendicular magnetic medium 1 past transducer head 6 is indicated in the figure by the arrow above medium 1.

With continued reference to FIG. 1, vertical lines 9 indicate grain boundaries of polycrystalline layers 4 and 5 of the layer stack constituting medium 1. Magnetically hard perpendicular recording layer 5 is epitaxially formed on interlayer 4, and while the grains of each polycrystalline layer are of differing widths (as measured in a horizontal direction) represented by a grain size distribution, they are generally in vertical registry (i.e., vertically "correlated" or aligned). Completing the layer stack is a protective overcoat layer 11, such as of a diamond-like carbon (DLC), formed over hard magnetic layer 5, and a lubricant topcoat layer 12, such as of a perfluoropolyethylene material, formed over the protective overcoat layer.

Substrate 2 is typically annular disk-shaped, i.e., with an inner diameter ("ID") and an outer diameter ("OD"), and comprised of a non-magnetic metal or alloy, e.g., Al or an Al-based alloy, such as Al—Mg having an Ni—P plating layer on the deposition surface thereof, or substrate 2 is comprised of a suitable glass, ceramic, glass-ceramic, polymeric material, or a composite or laminate of these materials. Optional adhesion layer 2A, if present, may comprise an up to about 30 Å thick layer of a material such as Ti or a Ti alloy; soft magnetic underlayer 3 is typically comprised of an about 500 to about 4,000 Å thick layer, typically about 2,000 Å (~200 nm) thick, of a soft magnetic material selected from the group consisting of Ni, NiFe (Permalloy), Co, CoZr, CoZrCr, CoZrNb, CoFeZrNb, CoFe, Fe, FeN, FeSiAl, FeSiAlN, FeCoB, FeCoC, etc.; interlayer 4 typically comprises an up to about 300 Å thick layer or layers of non-magnetic material(s), such as Ru, TiCr, Ru/CoCr$_{37}$Pt$_6$, RuCr/CoCrPt, etc.; and the at least one magnetically hard recording layer 5 is typically comprised of an about 100 to about 250 Å thick layer(s) of Co-based alloy(s) including one or more elements selected from the group consisting of Cr, Fe, Ta, Ni, Mo, Pt, V, Nb, Ge, B, and Pd, iron nitrides or oxides, or a (CoX/Pd or Pt)$_n$ multilayer magnetic superlattice structure, where n is an integer from about 10 to about 25, each of the alternating, thin layers of Co-based magnetic alloy is from about 2 to about 3.5 Å thick, X is an element selected from the group consisting of Cr, Ta, B, Mo, Pt, W, and Fe, and each of the alternating thin, non-magnetic layers of Pd or Pt is up to about 10 Å thick. Each type of magnetic hard recording layer material has perpendicular anisotropy arising from magneto-crystalline anisotropy ($1^{st}$ type) and/or interfacial anisotropy ($2^{nd}$ type).

According to conventional manufacturing methodology, a majority of the above-described layers constituting perpendicular magnetic recording media are deposited by cathode sputtering, typically by means of multi-cathode and/or multi-chamber sputtering apparatus wherein a separate cathode comprising a selected target material is provided for deposition of each component layer of the stack and the sputtering conditions are optimized for the particular component layer to be deposited. Each cathode comprising a selected target material can be positioned within a respective process sub-chamber or region located within a larger chamber, or in one of a plurality of separate, serially interconnected process chambers each dedicated for deposition of a particular layer. According to such conventional manufacturing technology, a plurality of media substrates, typically in annular disk form, are serially transported by means of a multi-apertured pallet or similar type holder, in linear or circular fashion, depending upon the physical configuration of the particular apparatus utilized, from one sub-chamber or region and/or process chamber to another for sputter deposition of a selected layer thereon.

Sputter deposition of relatively thick component layers of magnetic recording media, particularly the magnetically soft underlayer (SUL) of perpendicular media, in continuous, automatic fashion utilizing the above-described multi-chamber type sputtering apparatus is problematic for the following reasons:

(1) formation of relatively thick media component layers in a single process chamber by means of sputtering utilizing a single sputter deposition source requires a very costly high power, high deposition rate sputtering source to achieve the requisite layer thickness at substrate transport rates consistent with the high product throughput rates necessary for economic competitiveness; and (2) alternatively, formation of relatively thick media component layers in a single process chamber by means of sputtering utilizing a single, lower power, lower deposition rate sputtering source requires an extremely elongated process chamber and correspondingly extremely elongated sputter deposition source to achieve the requisite layer thickness at substrate transport rates consistent with the high product throughput rates necessary for economic competitiveness.

Approaches for overcoming/avoiding the above-described difficulties and disadvantages in sputter-depositing relatively thick media component layers as part of a continuous, automated manufacturing process at satisfactory product throughput rates and in a cost-effective manner involve forming the relatively thick media component layer, e.g., the magnetically soft underlayer (SUL) of perpendicular magnetic recording media, in several stages or sub-layers, either by means of a plurality of serially arranged sputter deposition sub-chambers or regions located in a single, larger station or chamber of a multi-chamber apparatus, or by means of a plurality of serially arranged sputter deposition stages located in a respective plurality of serially arranged, separate/independent stations or chambers of a multi-chamber apparatus.

However, either of the above approaches entails a disadvantage/drawback in that formation of thick layers of the magnetically soft underlayer material on the shields surrounding the outer periphery (OD) of the annular disk-shaped substrates, eventually leads to flaking-off of the deposited SUL material, with possible deposition of the flaked-off SUL material on the substrate surfaces. This in turn leads to layer defects and reduction in acceptable product yield.

In view of the foregoing, there exists a clear need for means and methodology for manufacturing improved, high areal recording density, high performance perpendicular magnetic recording media, which means and methodology avoid the disadvantages and drawbacks associated with the above-described means and methodology, and which facilitate high throughput, cost-effective, automated manufacture of high performance perpendicular magnetic recording media.

The present invention, therefore, addresses and solves the above-described problems, drawbacks, and disadvantages relating to the poor efficiency and product throughput rates associated with the above-described means and methodology for the manufacture of high performance perpendicular magnetic recording media, while maintaining full compatibility with all aspects of automated magnetic media manufacture.

DISCLOSURE OF THE INVENTION

An advantage of the present invention is an improved cathode sputtering apparatus for forming uniform thickness layers of a selected material on substrate surfaces.

Another advantage of the present invention is an improved apparatus for forming uniform thickness layers of a selected material on substrate surfaces by means of multi-stage cathode sputter deposition.

Yet another advantage of the present invention is an improved method for forming uniform thickness layers of a selected material on substrate surfaces.

Still another advantage of the present invention is an improved method for forming uniform thickness layers of a selected material on substrate surfaces by means of multi-stage cathode sputter deposition.

A further advantage of the present invention is an improved method for manufacturing magnetic recording media comprising uniform thickness layers of a selected material on substrate surfaces by means of multi-stage cathode sputter deposition.

Additional advantages and other features of the present invention will be set forth in the description which follows and in part will become apparent to those having ordinary skill in the art upon examination of the following or may be learned from the practice of the present invention. The advantages of the present invention may be realized and obtained as particularly pointed out in the appended claims.

According to an aspect of the invention, the foregoing and other advantages are obtained in part a cathode sputtering apparatus adapted for forming a uniform thickness layer of a selected material on at least one surface of at least one substrate/workpiece in a multi-stage process comprising deposition of a plurality of sub-layers, comprising:

(a) a first group of spaced-apart cathode/target assemblies; and (b) means for transporting at least one substrate/workpiece past each cathode/target assembly of the first group of cathode/target assemblies for deposition of a first plurality of sub-layers on a first surface of the at least one substrate/workpiece; wherein:

(i) each cathode/target assembly of the first group of cathode/target assemblies comprises a sputtering surface oriented substantially parallel to the first surface of the at least one substrate/workpiece; and (ii) the first group of cathode/target assemblies is adapted to provide sub-layers with different sputtered film thickness profiles, such that the first plurality of sub-layers collectively form the uniform thickness layer of the selected material.

According to a preferred embodiment of the present invention, the apparatus further comprises:

(c) a second group of spaced-apart cathode/target assemblies opposite the first group of spaced-apart cathode/target assemblies and adapted for forming a uniform thickness layer of the selected material on a second surface of the at least one substrate/workpiece in a multi-stage process comprising deposition of a second plurality of sub-layers, wherein:

(i) each cathode/target assembly of the second group of cathode/target assemblies comprises a sputtering surface oriented substantially parallel to said second surface of the at least one substrate/workpiece;
  (ii) the second group of cathode/target assemblies is adapted to provide sub-layers with different sputtered film thickness profiles, such that the second plurality of sub-layers collectively form the uniform thickness layer of the selected material on the second surface of the at least one substrate/workpiece; and
  (iii) the means for transporting the at least one substrate/workpiece past each cathode/target assembly of the first group of cathode/target assemblies further comprises means for transporting the at least one substrate/workpiece past each cathode/target assembly of the second group of cathode/target assemblies for deposition of the second plurality of sub-layers on the second surface of the at least one substrate/workpiece.

Further preferred embodiments of the present invention include those wherein: the cathode/target assemblies of the first and second groups of cathode/target assemblies are in substantial vertical registry; the cathode/target assemblies of the first and second groups of cathode/target assemblies are located in a single vacuum chamber and form an in-line or a circular-shaped arrangement within said vacuum chamber; the cathode/target assemblies of the first and second groups of cathode/target assemblies are located in a plurality of vacuum chambers and the plurality of vacuum chambers form an in-line or a circularly-shaped arrangement of chambers; each cathode/target assembly of the first and second groups of cathode/target assemblies is a planar magnetron cathode/target assembly including a magnetron magnet means, and the magnetron magnet means of at least some of the planar magnetron cathode/target assemblies are of different lengths, widths, or diameters; and the sputtering surfaces of at least some cathode/target assemblies of the first and second groups of cathode/target assemblies are located at different spacings from the first and second surfaces of the at least one substrate/workpiece.

Still further preferred embodiments of the present invention include those wherein: the means for transporting the at least one substrate/workpiece past the first and second groups of cathode/target assemblies for deposition of the first and second pluralities of sub-layers comprises means for mounting and transporting at least one disk-shaped substrate/workpiece; and the apparatus further comprises shield means in spaced adjacency to the periphery of the sputtering surface of each cathode/target assembly.

Another aspect of the present invention is a method of forming a uniform thickness layer of a selected material on at least one surface of at least one substrate/workpiece by means of a multi-stage process comprising sputter deposition of a plurality of sub-layers, comprising steps of:

(a) providing a multi-stage cathode sputtering apparatus comprising a first group of spaced-apart cathode/target assemblies and a means for transporting at least one substrate/workpiece past each cathode/target assembly of the first group of cathode/target assemblies, each cathode/target assembly comprising a sputtering surface oriented substantially parallel to the first surface of the at least one substrate/workpiece during transport of the at least one substrate/workpiece past the first group of cathode/target assemblies, the first group of cathode/target assemblies adapted for providing different sputtered film thickness profiles; and
  (b) transporting the at least one substrate/workpiece past each cathode/target assembly while providing different sputtered film thickness profilers from at least some of the cathode/target assemblies, such that a first plurality of sub-layers is deposited on the first surface of the at least one substrate/workpiece which collectively form a uniform thickness layer of the selected material.

According to preferred embodiments of the present invention, step (a) further comprises providing a multi-stage cathode sputtering apparatus comprising a second group of spaced-apart cathode target assemblies, each comprising a sputtering surface oriented substantially parallel to a second surface of the at least one substrate/workpiece during transport of the at least one substrate/workpiece past each cathode/target assembly of the second group of cathode/target assemblies, the second group of cathode/target assemblies adapted for providing different sputtered film thickness profiles; and step (b) further comprises transporting the at least one substrate/workpiece past each cathode/target assembly of the second group of cathode/target assemblies while providing different sputtered film thickness profiles from at least some of the cathode/target assemblies, such that a second plurality of sub-layers is deposited on the second surface of the at least one substrate/workpiece which collectively form a uniform thickness layer of the selected material.

Further preferred embodiments of the present invention include those wherein: step (a) comprises providing a multi-stage cathode sputtering apparatus wherein the first and second groups of spaced-apart cathode target assemblies are in substantial vertical registry and step (b) comprises substantially simultaneously forming a uniform thickness layer of the selected material on each of the first and second surfaces of the at least one substrate/workpiece; step (a) comprises providing a multi-stage cathode sputtering apparatus wherein the cathode/target assemblies of the first and second groups of cathode/target assemblies form an in-line or circular-shaped arrangement in a single vacuum chamber; or step (a) comprises providing a multi-stage cathode sputtering apparatus wherein the cathode/target assemblies of the first and second groups of cathode/target assemblies are located in a plurality of vacuum chambers and the plurality of vacuum chambers form an in-line or circular-shaped arrangement.

Still further embodiments of the present invention include those wherein: step (a) comprises providing a multi-stage cathode sputtering apparatus wherein each cathode/target assembly of the first and second groups of cathode/target assemblies is a planar magnetron cathode/target assembly including a magnetron magnet means and the magnetron magnet means of at least some of the planar magnetron cathode/target assemblies are of different lengths, widths, or diameters; or step (a) comprises providing a multi-stage cathode sputtering apparatus wherein the sputtering surfaces of at least some cathode/target assemblies of the first and second groups of cathode/target assemblies are located at different spacings from the first and second surfaces of the at least one substrate/workpiece.

Yet further preferred embodiments of the present invention include those wherein: step (a) comprises providing a multi-stage cathode sputtering apparatus wherein the means for transporting the at least one substrate/workpiece past each of the first and second groups of cathode/target assemblies comprises means for mounting and transporting at least one disk-shaped substrate/workpiece; and step (a) comprises providing a multi-stage cathode sputtering apparatus further comprising shield means in spaced adjacency to the periphery of the sputtering surface of each cathode/target assembly.

According to a preferred application of the inventive method, step (b) comprises transporting at least one annular disk-shaped precursor substrate for a perpendicular magnetic recording medium past each cathode/target assembly of the first and second groups of cathode/target assemblies and forming a magnetically soft underlayer (SUL) on the first and second surfaces of the precursor substrate as the uniform thickness layer of the selected material. E.g., step (b) comprises forming an about 500 to about 4,000 Å thick layer of a soft magnetic material selected from the group consisting of Ni, NiFe (Permalloy), Co, CoZr, CoZrCr, CoZrNb, CoFeZrNb, CoFe, Fe, FeN, FeSiAl, FeSiAlN, FeCoB, FeCoC on the first and second surfaces of the at least one precursor substrate.

Additional advantages and aspects of the present invention will become readily apparent to those skilled in the art from the following detailed description, wherein embodiments of the present invention are shown and described, simply by way of illustration of the best mode contemplated for practicing the present invention. As will be described, the present invention is capable of other and different embodiments, and its several details are susceptible of modification in various obvious respects, all without departing from the spirit of the present invention. Accordingly, the drawings and description are to be regarded as illustrative in nature, and not as limitative.

BRIEF DESCRIPTION OF THE DRAWINGS

The following detailed description of the embodiments of the present invention can best be understood when read in conjunction with the following drawings, in which the various features are not necessarily drawn to scale but rather are drawn as to best illustrate the pertinent features; conventional features such as gas inlets and outlets, vacuum means, air locks, buffer chambers, inlet/outlet chambers, etc., are not shown for illustrative simplicity; and like reference numerals are employed throughout for designating similar features, wherein:

FIG. 2 (A) schematically illustrates, in simplified cross-sectional view, three deposition stages of a cathode sputtering apparatus according to an embodiment of the present invention;

FIG. 2 (B) schematically illustrates the (relative) sputtered film thickness profile (or distribution) for each of the three deposition stages of the apparatus of FIG. 2 (A) and the collective (or overall) sputtered film thickness profile;

FIG. 3 (A) schematically illustrates, in simplified cross-sectional view, three deposition stages of a cathode sputtering apparatus according to another embodiment of the present invention;

FIG. 3 (B) schematically illustrates the (relative) sputtered film thickness profile (or distribution) for each of the three deposition stages of the apparatus of FIG. 3 (A) and the collective (or overall) sputtered film thickness profile;

FIGS. 4 (A) and 4 (B), respectively schematically illustrate, in simplified top sectional views, in-line and circularly-configured single chamber, three deposition stage cathode sputtering apparatus according to embodiments of the invention; and FIGS. 5 (A) and 5 (B), respectively schematically illustrate, in simplified top sectional views, in-line and circularly-configured multi-chamber, three deposition stage cathode sputtering apparatus according to embodiments of the invention.

DESCRIPTION OF THE INVENTION

The present invention addresses and solves quality, yield, throughput, and manufacturing cost-effectiveness problems associated with processing techniques for automated, continuous manufacture of a variety of products requiring deposition of a plurality of thin film component layers on a substrate, wherein at least one of the thin film layers is relatively thicker. The invention, therefore, has particular utility in the continuous, automated manufacture of high areal recording density perpendicular magnetic recording media, e.g., in hard disk form, which perpendicular media require formation of a relatively thick soft magnetic underlayer (SUL), as described in detail supra. Further, the invention advantageously facilitates high product throughput, continuous, automated manufacture of such perpendicular media in hard disk form, while maintaining full compatibility with all aspects and requirements of automated manufacturing technology and methodology.

More specifically, sputter deposition of relatively thick component layers of magnetic recording media, particularly the magnetically soft underlayer (SUL) of perpendicular media, in continuous, automatic fashion utilizing multi-chamber type sputtering apparatus is problematic for the following reasons:

(1) formation of relatively thick media component layers in a single process chamber by means of sputtering utilizing a single sputter deposition source requires a very costly high power, high deposition rate sputtering source to achieve the requisite layer thickness at substrate transport rates consistent with the high product throughput rates necessary for economic competitiveness; and (2) alternatively, formation of relatively thick media component layers in a single process chamber by means of sputtering utilizing a single, lower power, lower deposition rate sputtering source requires an extremely elongated process chamber and correspondingly extremely elongated sputter deposition source to achieve the requisite layer thickness at substrate transport rates consistent with the high product throughput rates necessary for economic competitiveness.

An approach for overcoming/avoiding the above-described difficulties and disadvantages in sputter-depositing relatively thick media component layers as part of a continuous, automated manufacturing process at satisfactory product throughput rates and in a cost-effective manner, involve forming the relatively thick media component layer, e.g., the magnetically soft underlayer (SUL) of perpendicular magnetic recording media, in several stages or sub-layers, by means of a plurality of serially arranged sputter deposition sub-chambers or regions located in a single, larger station or chamber of a multi-chamber apparatus or in a respective plurality of serially arranged, separate/independent stations or chambers of a multi-chamber apparatus.

However, this approach entails a disadvantage/drawback in that formation of thick layers of the magnetically soft underlayer material on the shields surrounding the outer periphery (OD) of the annular disk-shaped substrates of hard disk recording media eventually leads to flaking-off of the deposited SUL material from the shields, with possible deposition of the flaked-off SUL material on the substrate surfaces. This, in turn, leads to layer defects and reduction in acceptable product yield.

The present invention, therefore, is based upon recognition by the inventors that continuous, automated formation of a relatively thick layer of a selected material, e.g., the SUL of perpendicular magnetic recording media, can be satisfactorily performed (e.g., with uniform thickness over the substrate surface) in cost-effective manner by means of a multi-stage sputter deposition process utilizing a sputter deposition apparatus comprised of a plurality of serially arranged cathode/target assemblies for deposition of a plurality of sub-layers of the selected material, wherein the cathode/target assemblies are adapted for providing the sub-layers with different sputtered film thickness profiles (or distributions), such that the sub-layers collectively form the uniform thickness layer of the selected material.

As a consequence of the inventive means and methodology, the previous problems/drawbacks associated with excessive sputter deposition of the SUL material on the cathode/target assembly shields, followed by flaking off and re-deposition of the SUL material on the substrates are effectively avoided, or at least substantially reduced, while product quality and throughput yields are increased.

Figure 2A:
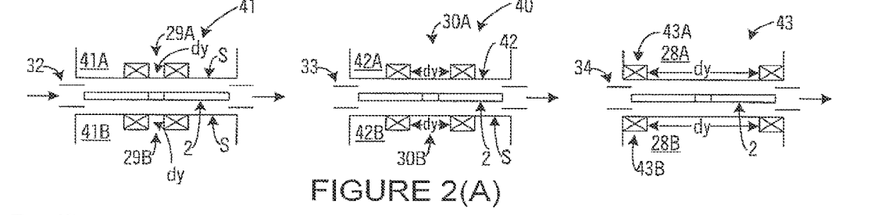

Referring now to FIG. 2 (A) schematically illustrated therein, in very simplified cross-sectional view, are three deposition stages of an in-line cathode sputtering apparatus 20 according to an embodiment of the invention. As illustrated, apparatus 20 includes (at least) three serially arranged deposition stations 21, 22, and 23, each comprised of a facing pair of cathode/target assemblies $21_A$-$21_B$, $22_A$-$22_B$, and $23_A$-$23_B$ with respective pairs of shields 24, 25, and 26 in spaced adjacency to the peripheries of the sputtering surfaces S.

In a typical application according to the invention, e.g., manufacture of disk-shaped perpendicular magnetic recording media, a dual-sided, annular disk-shaped precursor substrate/workpiece 2 for magnetic media (optionally with an adhesion layer 2A thereon) is supplied to apparatus 20 at an input end thereof adjacent cathode/target assembly $21_A$-$21_B$ and transported through apparatus 20 for serial (i.e., sequential) deposition thereon of a plurality of sub-layers (illustratively three sub-layers) of a magnetically soft underlayer (SUL) 3 at preferably circularly-shaped cathode/target assemblies $21_A$-$21_B$, $22_A$-$22_B$, and $23_A$-$23_B$.

According to the invention, the spacings, i.e., distances d, between the sputtering surfaces S of the cathode/target assemblies $21_A$-$21_B$, $22_A$-$22_B$, and $23_A$-$23_B$ and the precursor substrate/workpiece 2 are different for each deposition stage, i.e., different for deposition of each sub-layer of SUL 3. More specifically, according to the illustrated embodiment, the distances between the sputtering surfaces S of the cathode/target assemblies $21_A$-$21_B$, $22_A$-$22_B$, and $23_A$-$23_B$ and the precursor substrate/workpiece 2 are increased as the substrate/workpiece moves from an upstream cathode/target assembly to a downstream cathode/target assembly (in the direction indicated by the arrows in FIG. 2 (A)) for sequential deposition of the various sub-layers, such that $d_3 > d_2 > d_1$.

Figure 2B:
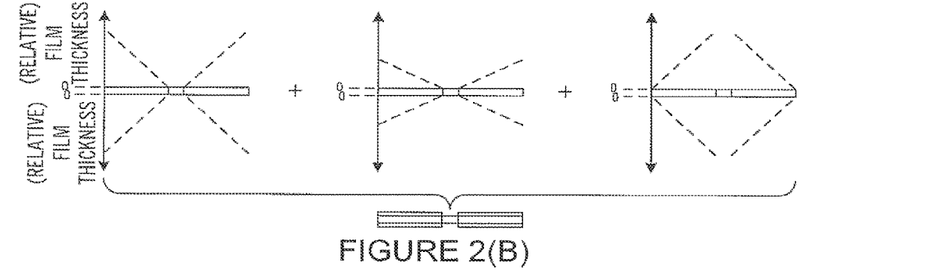

Adverting to FIG. 2 (B), schematically illustrated therein are the (relative) sputtered film thickness profiles (or distributions) of the three illustrated deposition stages of apparatus 20 of FIG. 2 (A) and the collective (or overall) sputtered film thickness profile. As is evident from FIG. 2 (B), the (relative) sputtered film thickness profile (or distribution) is a function of the spacing d between the sputtering surface S and the precursor substrate/workpiece 2 during sputter deposition of the sub-layer. Specifically, a relatively narrow spacing $d=d_1$ (as with the first cathode/target assembly 21) provides a relatively steeply inclined sputtered film thickness profile, i.e., steeply increasing film thickness from the ID to the OD of the annular disk-shaped substrate/workpiece; a moderately increased spacing $d=d_2$ (as with the second cathode/target assembly 22) provides a somewhat less steeply inclined sputtered film thickness profile, i.e., less steeply increasing film thickness from the ID to the OD of the disk; and a significantly increased spacing $d=d_3$ (as with the third cathode/target assembly 23) provides an inverted, steeply inclined sputtered film thickness profile, i.e., steeply decreasing film thickness from the ID to the OD of the disk.

According to the invention, the sputtering surface-substrate/workpiece spacings $d_1$, $d_2$, and $d_3$ at cathode/target assemblies $21_A$-$21_B$, $22_A$-$22_B$, and $23_A$-$23_B$ are selected for a particular application such that the respective sub-layers formed thereat collectively form a substantially uniform thickness layer of the selected material on each surface of substrate 2, as shown in FIG. 2 (B).

Figure 3A:
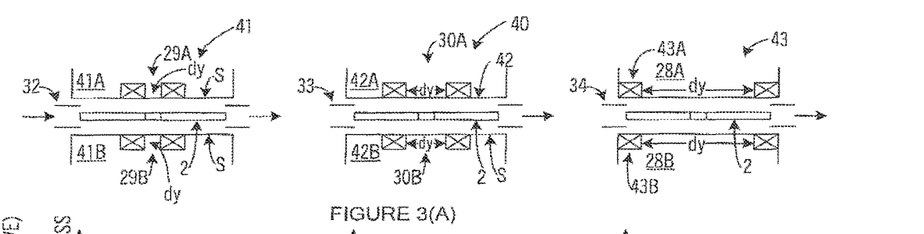

Referring now to FIG. 3 (A) schematically illustrated therein, in simplified cross-sectional view, are three deposition stages of a cathode sputtering apparatus 25 according to another embodiment of the present invention. As illustrated, apparatus 25 includes (at least) three serially arranged deposition stations 26, 27, and 28, each comprised of a facing pair of e.g., circularly-shaped, planar magnetron cathode/target assemblies $26_A$-$26_B$, $27_A$-$27_B$, and $28_A$-$28_B$ of same diameter but with respective circularly-shaped magnetron magnet assemblies $29_A$-$29_B$, $30_A$-$30_B$, and $31_A$-$31_B$ of progressively increasing diameters $d_3 > d_2 > d_1$. In contrast with the previous embodiment, the spacing between the sputtering surface S of each of the planar magnetron cathode/target assemblies and the substrate/workpiece 2 is the same for each deposition stage. However, as in the previous embodiment, respective pairs of shields 32, 33, and 34 are provided in spaced adjacency to the peripheries of the sputtering surfaces S of each of the cathode/target assemblies $26_A$-$26_B$, $27_A$-$27_B$, and $28_A$-$28_B$.

As before, in a typical application according to the invention, e.g., manufacture of disk-shaped perpendicular magnetic recording media, a dual-sided, annular disk-shaped precursor substrate/workpiece 2 for magnetic media (optionally with an adhesion layer 2A thereon) is supplied to apparatus 25 at an input end thereof adjacent cathode/target assembly $26_A$-$26_B$ and transported through apparatus 25 for serial (i.e., sequential) deposition thereon of a plurality of sub-layers (illustratively three sub-layers) of a magnetically soft underlayer (SUL) 3 at the preferably circularly-shaped cathode/target assemblies $26_A$-$26_B$, $27_A$-$27_B$, and $28_A$-$28_B$.

According to the invention, the diameters d, of the magnetron magnet assemblies $29_A$-$29_B$, $30_A$-$30_B$, and $31_A$-$31_B$ of respective cathode/target assemblies $21_A$-$21_B$, $22_A$-$22_B$, and $23_A$-$23_B$ are different for each deposition stage, i.e., different for deposition of each sub-layer of SUL 3. More specifically, according to the illustrated embodiment, the diameters of the magnetron magnet assemblies of the planar magnetron cathode/target assemblies $26_A$-$26_B$, $27_A$-$27_B$, and $28_A$-$28_B$ increase as the substrate/workpiece moves from an upstream cathode/target assembly to a downstream cathode/target assembly for sequential deposition of the various sub-layers, such that $d_3 > d_2 > d_1$.

Figure 3B:
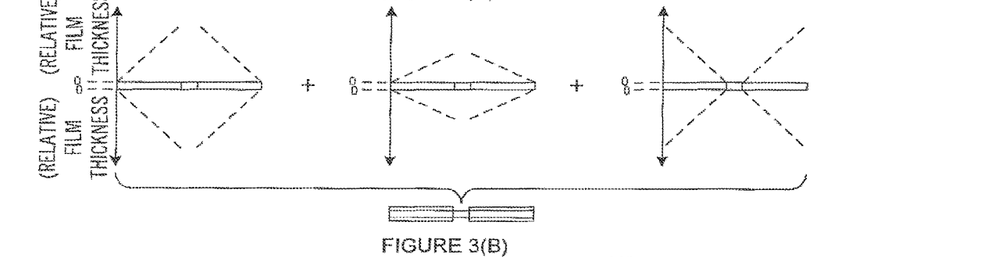

Adverting to FIG. 3 (B), schematically illustrated therein are the (relative) sputtered film thickness profiles (or distributions) of the three illustrated deposition stages of apparatus 25 of FIG. 3 (A) and the collective (or overall)

sputtered film thickness profile. As is evident from FIG. 3 (B), the (relative) sputtered film thickness profile (or distribution) is a function of the diameter d of the magnetron magnet assembly. Specifically, the first cathode/target assembly $26_A$-$26_B$ with the relatively narrow diameter d=$d_1$ centrally located magnetron magnet assemblies $29_A$-$29_B$ provides a relatively steeply inclined sputtered film thickness profile, i.e., steeply decreasing film thickness from the ID to the OD of the annular disk-shaped substrate/workpiece; the second cathode/target assembly $27_A$-$27_B$ with magnetron magnet assembly $30_A$-$30_B$ with a moderately increased diameter d=$d_2$ provides a somewhat less steeply inclined sputtered film thickness profile, i.e., less steeply decreasing film thickness from the ID to the OD of the disk; and the third cathode/target assembly $28_A$-$28_B$ with magnetron magnet assembly $31_A$-$31_B$ with significantly increased diameter d=$d_3$ provides an inverted, steeply inclined sputtered film thickness profile, i.e., steeply increasing film thickness from the ID to the OD of the disk.

According to the invention, the magnetron magnet diameters $d_1$, $d_2$, and $d_3$ of cathode/target assemblies $26_A$-$26_B$, $27_A$-$27_B$, and $28_A$-$28_B$ are selected for a particular application such that the respective sub-layers formed thereat collectively form a substantially uniform thickness layer of the selected material, as shown in FIG. 3 (B).

In a preferred embodiment of the invention, at least one annular disk-shaped precursor substrate for a perpendicular magnetic recording medium is supplied to an inlet end of either of the illustrated apparatus embodiments and transported past each cathode/target assembly of the first and second groups of cathode/target assemblies while forming a relatively thick layer of a magnetically soft material as a substantially uniform thickness SUL on both surfaces of the precursor substrate. Illustratively, a plurality of sub-layers of a soft magnetic material selected from the group consisting of Ni, NiFe (Permalloy), Co, CoZr, CoZrCr, CoZrNb, CoFeZrNb, CoFe, Fe, FeN, FeSiAl, FeSiAlN, FeCoB, FeCoC resulting in a layer having a substantially uniform, overall thickness from about 500 to about 4,000 Å is formed on the first and second surfaces of the precursor substrate in a plurality of deposition stages.

Figure 4A:
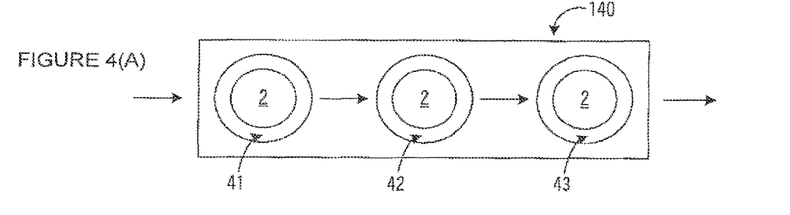
Figure 4B:
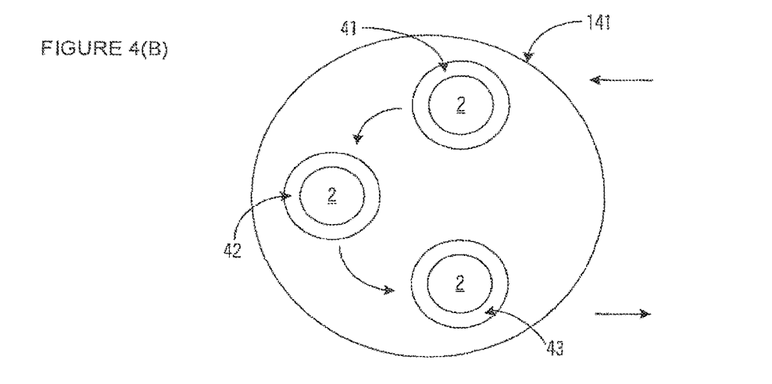
Figure 5A:
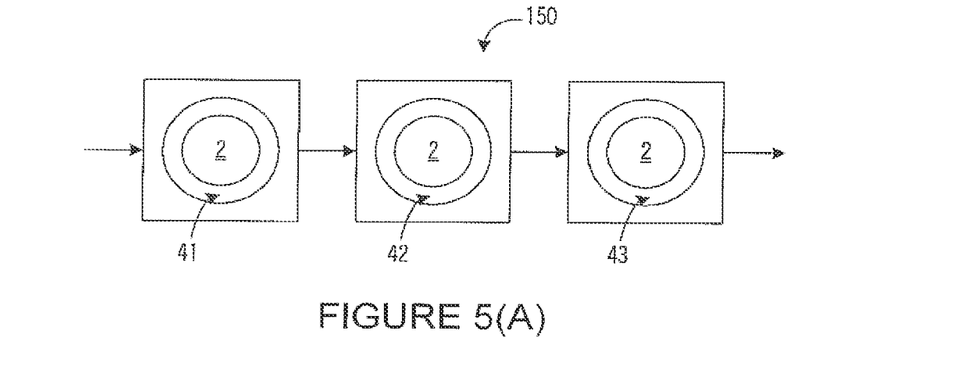
Figure 5B:
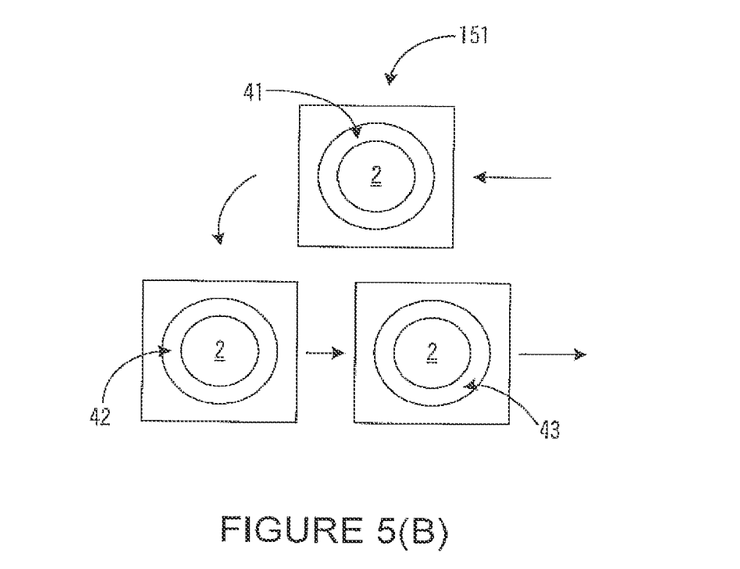

The invention advantageously admits of a variety of apparatus configurations, as for example, shown in FIGS. 4 (A)-4 (B) and FIGS. 5 (A)-5 (B). More specifically, FIGS. 4 (A) and 4 (B) respectively schematically illustrate, in simplified top sectional views, in-line and circularly-configured single chamber, three deposition stage cathode sputtering apparatus 40 and 41 comprising a single vacuum chamber; and FIGS. 5 (A) and 5 (B) schematically illustrate, in simplified top sectional views, in-line and circularly-configured multi-chamber, three deposition stage cathode sputtering apparatus 50 and 51 comprising separate vacuum chambers for each cathode/target assembly. In each instance, the direction of motion of substrates/workpieces 2 through the apparatus is indicated by the arrows in the figures.

The invention is not limited to use with the illustrated circularly-shaped cathode/target assemblies and annular disk-shaped substrates/workpieces, e.g., the invention may be utilized with linearly extending cathode/target assemblies and substrates/workpieces. Further, the apparatus may comprise more than three sputter deposition stations or stages, and some of the sputter stations or stations may be identically structured, as with the same sputtering surface-substrate distances and/or same-sized magnetron magnet assemblies. Moreover, the invention is not limited to use with circularly-configured magnetron magnet assemblies; rather the magnetron magnet assemblies may be of different lengths, widths, or diameters.

In summary, the present invention provides improved means and methodology for continuous, automated manufacture of products requiring sputter deposition of relatively thick layers with substantially uniform thickness, as in the fabrication of high areal recording density, high performance perpendicular magnetic recording media with relatively thick magnetically soft underlayers. The invention further affords product throughput rates consistent with the requirements for cost-effective manufacture while maintaining full compatibility with all aspects of automated manufacturing technology. The invention substantially eliminates the disadvantages and drawbacks associated with conventional multi-stage deposition processing for magnetically soft underlayers, including, inter alia, deleterious flaking off of sputtered SUL material from shield members of the sputtering cathode/target assemblies.

In the previous description, numerous specific details are set forth, such as specific materials, structures, processes, etc., in order to provide, a better understanding of the present invention. However, the present invention can be practiced without resorting to the details specifically set forth. In other instances, well-known processing materials and techniques have not been described in detail in order not to unnecessarily obscure the present invention.

Only the preferred embodiments of the present invention and but a few examples of its versatility are shown and described in the present disclosure. It is to be understood that the present invention is capable of use in various other combinations and environments and is susceptible of changes and/or modifications within the scope of the inventive concept as expressed herein.

What is claimed is:

1. An apparatus comprising:
   a substrate comprising a first surface and
   a first layer on said first surface,
      wherein a thickness of said first layer continuously increases from an inner diameter to an outer diameter of said substrate, and
      wherein said first layer comprises a sub-layer for a magnetically soft underlayer operable to guide magnetic flux through a recording layer.

2. The apparatus according to claim 1, wherein said first layer comprises Ni, NiFe (Permalloy), Co, CoZr, CoZrCr, CoZrNb, CoFeZrNb, CoFe, Fe, FeN, FeSiAl, FeSiAlN, FeCoB, or FeCoC.

3. The apparatus according to claim 1, wherein said substrate is a dual-sided substrate further comprising a second surface on a side of said substrate opposite said first surface.

4. The apparatus according to claim 3, further comprising a second layer on said second surface, wherein a thickness of said second layer continuously increases from said inner diameter to said outer diameter of said substrate.

5. The apparatus according to claim 4, wherein said second layer comprises a sub-layer for a magnetically soft underlayer.

6. The apparatus according to claim 5, wherein said second layer comprises Ni, NiFe (Permalloy), Co, CoZr, CoZrCr, CoZrNb, CoFeZrNb, CoFe, Fe, FeN, FeSiAl, FeSiAlN, FeCoB, or FeCoC.

7. The apparatus according to claim 6, wherein said apparatus is a precursor for perpendicular magnetic recording media having high areal recording density.

8. The apparatus of claim 6, wherein said thickness of said first layer is in accordance with a function of spacing between a sputtering surface of a target and said first surface during sputter deposition.

9. An apparatus comprising:
a substrate comprising a first surface and
a first layer on said first surface,
wherein a thickness of said first layer continuously decreases from an inner diameter to an outer diameter of said substrate in accordance with a function of spacing between a sputtering surface of a target and said first surface during sputter deposition, and
wherein said first layer comprises a sub-layer for a magnetically soft underlayer operable to guide magnetic flux through a recording layer.

10. The apparatus according to claim 9, wherein said first layer comprises Ni, NiFe (Permalloy), Co, CoZr, CoZrCr, CoZrNb, CoFeZrNb, CoFe, Fe, FeN, FeSiAl, FeSiAlN, FeCoB, or FeCoC.

11. The apparatus according to claim 9, wherein said substrate is a dual-sided substrate further comprising a second surface on a side of said substrate opposite said first surface.

12. The apparatus according to claim 11, further comprising a second layer on said second surface, wherein a thickness of said second layer continuously decreases from said inner diameter to said outer diameter of said substrate.

13. The apparatus according to claim 12, wherein said second layer comprises a sub-layer for a magnetically soft underlayer.

14. The apparatus according to claim 13, wherein said second layer comprises Ni, NiFe (Permalloy), Co, CoZr, CoZrCr, CoZrNb, CoFeZrNb, CoFe, Fe, FeN, FeSiAl, FeSiAlN, FeCoB, or FeCoC.

15. The apparatus according to claim 14, wherein said apparatus is a precursor for perpendicular magnetic recording media having high areal recording density.

16. An apparatus comprising:
a dual-sided substrate comprising a first and a second surface,
wherein said second surface is on a side of said substrate opposite said first surface;
a first layer on said first surface,
wherein said first layer has a first angular thickness profile; and
a second layer on said second surface,
wherein said second layer has a second angular thickness profile, and
wherein said first layer and said second layer each comprise a sub-layer for a magnetically soft underlayer operable to guide magnetic flux through a recording layer.

17. The apparatus according to claim 16, wherein said first layer comprises Ni, NiFe (Permalloy), Co, CoZr, CoZrCr, CoZrNb, CoFeZrNb, CoFe, Fe, FeN, FeSiAl, FeSiAlN, FeCoB, or FeCoC.

18. The apparatus according to claim 17, wherein each of said first thickness profile and second thickness profile comprise continuously increasing layer thickness from an inner diameter to an outer diameter of said substrate.

19. The apparatus according to claim 17, wherein each of said first thickness profile and second thickness profile comprise continuously decreasing layer thickness from an inner diameter to an outer diameter of said substrate.

20. The apparatus of claim 16, wherein said first angular thickness profile and said second angular thickness profile are in accordance with a spacing between a sputtering surface of a target and said first surface and said second surface, respectively, during sputter deposition.

* * * * *